(12) United States Patent
Xu et al.

(10) Patent No.: US 11,073,734 B2
(45) Date of Patent: Jul. 27, 2021

(54) ARRAY SUBSTRATE AND METHOD OF MANUFACTURING THE SAME, DISPLAY PANEL AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Zhicai Xu, Beijing (CN); Ruilin Bi, Beijing (CN); Jiandong Guo, Beijing (CN); Zhulin Liu, Beijing (CN); Shouqiang Zhang, Beijing (CN); Kui Zhang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/892,918

(22) Filed: Jun. 4, 2020

(65) Prior Publication Data
US 2020/0301223 A1   Sep. 24, 2020

Related U.S. Application Data

(63) Continuation-in-part of application No. 16/328,719, filed as application No. PCT/CN2018/076657 on Feb. 13, 2018, now abandoned.

(30) Foreign Application Priority Data

May 4, 2017  (CN) .......................... 201710309241.8

(51) Int. Cl.
G02F 1/1362   (2006.01)
H01L 27/28    (2006.01)
(Continued)

(52) U.S. Cl.
CPC ...... *G02F 1/136286* (2013.01); *G02F 1/1368* (2013.01); *G02F 1/134336* (2013.01);
(Continued)

(58) Field of Classification Search
None
See application file for complete search history.

(56) References Cited

U.S. PATENT DOCUMENTS

| 2001/0010575 | A1* | 8/2001 | Yoshida | ............ G02F 1/134363 |
|---|---|---|---|---|
| | | | | 349/141 |
| 2002/0171779 | A1* | 11/2002 | Kimura | ............. G02F 1/134363 |
| | | | | 349/39 |

(Continued)

FOREIGN PATENT DOCUMENTS

| CN | 103558701 A | 2/2014 |
|---|---|---|
| CN | 104280931 A | 1/2015 |

(Continued)

OTHER PUBLICATIONS

International Search Report and English Translation of Box V of the Written Opinion dated May 10, 2018, received for corresponding PCT Application No. PCT/CN2018/076657.

(Continued)

*Primary Examiner* — Ryan Crockett
(74) *Attorney, Agent, or Firm* — Kinney & Lange, P.A.

(57) ABSTRACT

An array substrate includes: a base substrate, a gate line extending in a first direction, a data line extending in a second direction, and a pixel electrode layer, the first direction being substantially perpendicular to the second direction, the gate line and the data line defining a plurality of (Continued)

sub-pixel units, and a plurality of first and second common electrode lines electrically connected to each other and disposed in the same layer as the gate lines. The first common electrode line includes two first common electrode line first portions, and the second common electrode line extends in the second direction. The second common electrode line is located between and electrically connects the two first common electrode line first portions. The second common electrode line is located at a center line of the sub-pixel unit.

17 Claims, 8 Drawing Sheets

(51) Int. Cl.
  *H01L 27/12*     (2006.01)
  *G02F 1/1368*    (2006.01)
  *G02F 1/1343*    (2006.01)
  *G02F 1/1333*    (2006.01)
  *G02F 1/136*     (2006.01)

(52) U.S. Cl.
  CPC ...... *G02F 1/134363* (2013.01); *H01L 27/124* (2013.01); *H01L 27/1259* (2013.01); *H01L 27/283* (2013.01); *G02F 1/13606* (2021.01); *G02F 1/133305* (2013.01); *G02F 1/134345* (2021.01); *G02F 1/136295* (2021.01); *G02F 2201/121* (2013.01)

(56) References Cited

U.S. PATENT DOCUMENTS

| | | | | |
|---|---|---|---|---|
| 2005/0206824 A1* | 9/2005 | Son | ............... | G02F 1/134363 349/141 |
| 2009/0161047 A1* | 6/2009 | Cho | ............... | G02F 1/133516 349/106 |
| 2009/0225250 A1* | 9/2009 | Lyu | ............... | G02F 1/134363 349/44 |
| 2012/0038860 A1* | 2/2012 | Kim | ............... | G02F 1/134363 349/99 |
| 2013/0077010 A1* | 3/2013 | Takeda | ............... | G02F 1/1368 349/43 |
| 2013/0077028 A1* | 3/2013 | Miyazaki | ............... | G02F 1/134363 349/99 |
| 2015/0062510 A1* | 3/2015 | Chang | ............... | G02F 1/133512 349/110 |
| 2016/0252786 A1* | 9/2016 | Xian | ............... | G02F 1/136286 349/143 |
| 2016/0345456 A1* | 11/2016 | Chen | ............... | H05K 5/06 |
| 2017/0038653 A1* | 2/2017 | Xu | ............... | H01L 29/78633 |
| 2018/0224704 A1* | 8/2018 | Shao | ............... | G02F 1/136286 |
| 2019/0196288 A1 | 6/2019 | Xu et al. | | |
| 2019/0227396 A1 | 7/2019 | Shao et al. | | |

FOREIGN PATENT DOCUMENTS

| | | |
|---|---|---|
| CN | 104656333 A | 5/2015 |
| CN | 105824161 A | 8/2016 |
| CN | 106940504 A | 7/2017 |
| KR | 20150117414 A | 10/2015 |

OTHER PUBLICATIONS

First Chinese Office Action dated May 21, 2018, received for corresponding Chinese Application No. 201710309241.8.
Second Chinese Office Action dated Nov. 2, 2018, received for corresponding Chinese Application No. 201710309241.8.
Third Chinese Office Action dated Mar. 19, 2019, received for corresponding Chinese Application No. 201710309241.8.

* cited by examiner

ARRAY SUBSTRATE AND METHOD OF MANUFACTURING THE SAME, DISPLAY PANEL AND DISPLAY DEVICE

CROSS-REFERENCE TO RELATED APPLICATION

This application is a continuation-in-part of U.S. application Ser. No. 16/328,719 filed on Feb. 26, 2019, which is the national phase of PCT Application No. PCT/CN2018/076657 filed on Feb. 13, 2018, which in turn claims the benefit of Chinese Patent Application No. 201710309241.8 filed with the State Intellectual Property Office of China on May 4, 2017, the whole disclosures of which are incorporated herein by reference.

BACKGROUND

Technical Field

Embodiments of the present disclosure relate to field of display technology, and particularly, to an array substrate and a method of manufacturing the same, a display panel and a display device.

Description of Related Art

A liquid crystal display (LCD) panel has advantages such as light weight, thin thickness, low power consumption, ease of being driven, absence of baneful radiation and etc. and thus is widely used in a television, a notebook computer, a mobile phone, a personal digital assistant and others modern information apparatus and has a broad prospects of development. For a personal user, a curved display may bring a better display effect and vision experiment than a flat panel display, and thus becomes an important development direction of a liquid display panel.

A twisted nematic (TN) display panel is obtained by rotation by 90 degrees of between an array substrate and an opposite substrate. In a display panel working in a normally-white display mode, light leakage in a non-display region will degrade the contrast of an image when a black picture is displayed by the display panel. By contrast, a twisted nematic display panel may avoid light leakage in a normally-white display mode, which brings it to a dominant position in curved display field.

Thus, there is in related art at least technical problem about how to prevent light leakage while effectively increasing aperture ratio of a display panel.

SUMMARY

Embodiments of the present disclosure provide an array substrate array substrate, including: a base substrate, a gate line above the base substrate and extending in a first direction, a data line above a layer where the gate line is located and extending in a second direction, and a pixel electrode layer above a layer where the data line is located, the first direction being substantially perpendicular to the second direction, the gate line and the data line defining a plurality of sub-pixel units; wherein, the array substrate further includes: a plurality of first common electrode lines and a plurality of second common electrode lines electrically connected to each other and disposed in a same layer as the gate lines, wherein each of the plurality of first common electrode lines includes two first common electrode line first portions extending in the first direction, and the plurality of second common electrode lines extend in the second direction;

in one sub-pixel unit, one of the plurality of first common electrode lines and one of the plurality of second common electrode lines are included and the one of the plurality of first common electrode lines includes two first common electrode line first portions, the one of the plurality of second common electrode lines being located between and electrically connecting the two first common electrode line first portions, an orthographic projection of the one of the plurality of second common electrode lines on the base substrate is located approximately on a center line of an orthographic projection of the one sub-pixel unit on the base substrate.

In an embodiment, in the one sub-pixel unit, the one of the plurality of second common electrode lines and the two first common electrode line first portions are formed in a shape of "I".

In an embodiment, the pixel electrode layer includes a plurality of pixel electrodes arranged in an array; each of the plurality of sub-pixel units includes one of the plurality of pixel electrodes, the two first common electrode line first portions are respectively located at and respectively have first overlapping portions with either edge on opposite sides of a corresponding one of the pixel electrodes.

In an embodiment, the first common electrode line further includes a first common electrode line second portion and a first common electrode line third portion having a width greater than a width of the two first common electrode line first portions;

for the one sub-pixel unit, the first common electrode line second portion is connected to one of the two first common electrode line first portions and is located on a side of the one of the two first common electrode line first portions opposite to the corresponding one of the pixel electrodes, the first common electrode line third portion is connected to the other one of the two first common electrode line first portions and is located on a side of the other one of the two first common electrode line first portions opposite to the corresponding one of the pixel electrodes; the first common electrode line second portion and the first common electrode line third portion are located on opposite sides respectively of the corresponding one of the pixel electrode, so that the first common electrode line third portion of one sub-pixel unit and the first common electrode line second portion of another sub-pixel unit adjacent to the one sub-pixel unit in the second direction are located on either side of the gate line.

In an embodiment, the pixel electrode layer further includes: a bridge portion provided in the same layer as the pixel electrodes, and two ends of the bridge portion are respectively electrically connected, through common electrode vias located on either side of the gate line, to the first common electrode line third portion and the first common electrode line second portion of the another sub-pixel unit adjacent to the one sub-pixel unit in the second direction, which are located on either side of the gate line.

In an embodiment, orthographic projections of the two first common electrode line first portions on the base substrate and an orthographic projection of the data line on the base substrate have a second overlapping area, and a part of the two first common electrode line first portions located in the second overlapping region has an arc-shaped groove.

In an embodiment, the gate line includes a plurality of hollowed regions, the plurality of hollowed regions are arranged in the gate line along the first direction, and in an orthographic projection direction with respect to the base substrate, the date lines and the gate lines cross each other above the hollowed regions and both sides of one of the data lines are approximately spaced from both sides of a corresponding one of the hollowed regions of the gate lines by a equal distance in the first direction.

In an embodiment, the gate lines each include a first gate line and a second gate line, the first gate line and the second gate line are located on opposite sides of the corresponding one of the pixel electrodes respectively in the one sub-pixel unit; and, the first gate line includes a plurality of first rectangular grooves arranged in the first direction, and the second gate line includes a plurality of second rectangular grooves arranged in the first direction, the first common electrode line second portion of the one sub-pixel unit is arranged in the first rectangular groove of the first gate line and is spaced from two sides of the first rectangular groove at approximately equal intervals, the first common electrode line third portion of another one of the sub-pixels units adjacent to the one sub-pixel unit is located in the second rectangular groove of the second gate line and is spaced from two sides of the second rectangular groove at approximately equal intervals.

In an embodiment, the gate lines each include a first gate line and a second gate line, the first gate line and the second gate line are located on opposite sides of the corresponding one of the pixel electrodes respectively in the one sub-pixel unit; and, the first gate line includes a plurality of first rectangular grooves arranged in the first direction, and the second gate line includes a plurality of second rectangular grooves arranged in the first direction, so that in a row of sub-pixel units in the first direction, the plurality of hollowed regions and the plurality of first rectangular grooves in the first gate line are alternately and separatedly arranged, and the plurality of hollowed regions and the plurality of second rectangular grooves in the second gate line are alternately and separatedly arranged, the first common electrode line second portion of the one sub-pixel unit is arranged in the first rectangular groove of the first gate line and is spaced from two sides of the first rectangular groove at approximately equal intervals, the first common electrode line second portion of another one of the sub-pixels units adjacent to the one sub-pixel unit is located in the second rectangular groove of the second gate line and is spaced from two sides of the second rectangular groove at approximately equal intervals.

In an embodiment, the pixel electrode layer further includes: a connection portion provided in the same layer as the pixel electrodes, the connection portion being electrically connected to a drain electrode of a thin film transistor of the one sub-pixel unit through a drain electrode via located above the first common electrode line second portion, thereby electrically connecting the corresponding one of the pixel electrodes and the drain electrode of the thin film transistor.

In an embodiment, the orthographic projection of the data line on the base substrate covers an orthographic projection of a gap between two adjacent columns of the pixel electrodes on the base substrate.

In an embodiment, the orthographic projection of the data line on the base substrate and orthographic projections of the two adjacent columns of the pixel electrodes on the base substrate have third overlapping regions, which have the same width in the second direction.

In an embodiment, each of the plurality of pixel units includes a blue sub-pixel unit, a red sub-pixel unit, and a green sub-pixel unit, and in the orthographic projection direction with respect to the base substrate, the second common electrode line overlaps the blue sub-pixel unit and does not overlap the red sub-pixel unit and the green sub-pixel unit.

In an embodiment, the array substrate further includes: a color resist layer disposed between the layer where the data line is located and the pixel electrode layer, and a thickness of the color resist layer is set such that a maximum value of a capacitance generated between the date lines and the pixel electrodes in the array substrate is less than a predetermined value.

In an embodiment, the base substrate is a flexible base substrate and is made of polyvinylether phthalate, polyethylene naphthalate, polycarbonate, polyarylate, polyetherimide, polyethersulfone, polyimide or other plastic base plate; and/or the planarization layer is made of polyacrylic resin, polyepoxy-acrylic resin, photosensitive polyimide resin, polyester acrylic resin, polyurethane acrylate resin, phenolic epoxy acrylic resin or other organic insulating material; and/or the data lines and the drain and source electrodes are formed from materials including molybdenum, aluminum, tungsten, titanium, copper or an alloy combination thereof, the gate insulating layer and the passivation layer are formed from materials including silicon oxide, silicon nitride or a combination thereof, and the active layer is formed from a material including a polycrystalline silicon semiconductor material, an amorphous silicon semiconductor material, an oxide compound semiconductor material, or an organic semiconductor material.

Embodiments of the present disclosure further provide a display panel including: the array substrate above, and a counter substrate opposed to the array substrate.

In an embodiment, the display panel further includes: a black matrix disposed on a side of the counter substrate facing the array substrate; or the display panel including: a black matrix disposed on a side of the array substrate facing the counter substrate, and a color resist layer disposed between the layer where the data line is located and the pixel electrode layer, the black matrix being located at a gap between two adjacent color filters of the color filter layer; the black matrix is formed by stacking a red-light color filter and a blue-light color filter.

Embodiments of the present disclosure further provide a display device, including: the display panel above.

Embodiments of the present disclosure further provide a method of manufacturing the array substrate above, the method including:

provide a substrate substrate;

forming a gate line extending in the first direction above the base substrate;

forming a data line extending along the second direction above the layer where the gate line is located, the first direction being substantially perpendicular to the second direction;

forming a pixel electrode layer including a plurality of columns of pixel electrodes spaced from each other on the layer where the data line is located;

the method further includes:

forming simultaneously the gate line and a plurality of first common electrode lines and a plurality of second common electrode lines, extending in the first direction, on the base substrate, wherein each of the plurality of first common electrode lines includes two first common electrode line first portions extending in the first direction, and the plurality of second common electrode lines extend in the second direction;

in one sub-pixel unit, one of the plurality of first common electrode lines and one of the plurality of second common electrode lines are included and the one of the plurality of first common electrode lines includes two first common electrode line first portions, the one of the plurality of second common electrode lines being located between and electrically connecting the two first common electrode line first portions, an orthographic projection of the one of the plurality of second common electrode lines on the base substrate is located approximately on a center line of an orthographic projection of the one sub-pixel unit on the base substrate.

DETAILED DESCRIPTION

Figure 1:
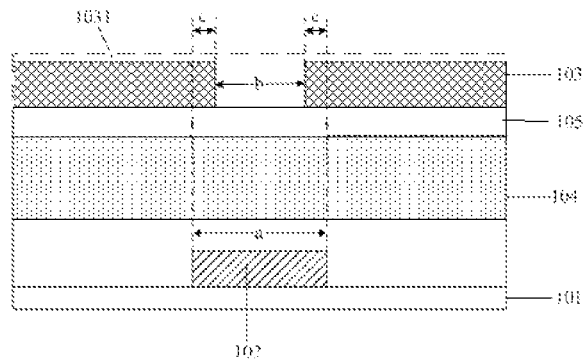
FIG. 1 is a structural schematic view of an array substrate according to an embodiment of the present disclosure.

For a curved display panel technology in related art, the display panel needs to be bent. When being bent, the array substrate and an opposite substrate of a display panel tend to shift and thus may result in occurrence of light leakage in the display panel. In addition, the size of a black matrix is increased to prevent the light leakage, which, however, reduces the aperture ratio of the display panel.

Embodiments of an array substrate and a method of manufacturing the same, a display panel and a display device according to the present disclosure will be described in detail in combination with the drawings.

Shapes and sizes of the layers shown in the drawings do not reflect a real scale of the array substrate or the display panel and are merely intended to schematically illustrate the content of the present disclosure.

An embodiment of the present disclosure provides an array substrate, as shown in FIG. 1, including: a base substrate 101, a data line 102 disposed on the base substrate 101 and a pixel electrode layer 103; wherein, the pixel electrode layer 103 includes a plurality of columns of pixel electrodes 1031 that are spaced from one another;

an orthographic projection of the data line 102 on the base substrate 101 covers an orthographic projection of a gap between two adjacent columns of pixel electrodes on the base substrate 101, and a width a of the data line 102 is greater than a width b of the gap between two adjacent columns of pixel electrodes.

In the above array substrate according to the embodiment of the present disclosure, as the orthographic projection of the data line 102 on the base substrate 101 covers the orthographic projection of the gap between two adjacent columns of pixel electrodes on the base substrate 101, and the width a of the data line 102 is greater than the width b of the gap between two adjacent columns of pixel electrodes, an electric field is formed between the data line 102 and the pixel electrode 1031 with longitudinal electric field lines having a direction directed from the array substrate to an opposite substrate, such that light leakage along a direction in which the data line extends may be prevented by controlling torsion of liquid crystal near an edge of the pixel electrode. Meanwhile, with this configuration, no black matrix or other types of light shielding components for shielding light is needed to prevent light from leaking, which effectively increases aperture ratio.

In the array substrate according to an embodiment of the present disclosure, the base substrate 101 may be a flexible base substrate, such as a plastic base plate with properties of good heat resistance and durability and made of, for example, polyvinylether phthalate, polyethylene naphthalate, polycarbonate, polyarylate, polyetherimide, polyethersulfone or polyimide. The base substrate 101 may also be a rigid base substrate, such as a glass base plate, and is not limited herein.

In an embodiment of the present disclosure, the orthographic projection of the data line 102 on the base substrate 101 may portionially cover the orthographic projections of the two adjacent columns of pixel electrodes on the base substrate 101 such that a normal display will not be affected.

In an embodiment of the present disclosure, as shown in FIG. 1, the orthographic projection of the data line 102 on the base substrate 101 may overlap with the orthographic projections of the two adjacent columns of pixel electrodes on the base substrate 101 respectively in overlapping regions having a same width c.

In an embodiment of the present disclosure, the orthographic projection of the data line 102 on the base substrate 101 may overlap with the orthographic projections of the two adjacent columns of pixel electrodes on the base substrate 101 respectively in overlapping regions having different widths, which is not limited herein.

Generally, a charging process of the pixel electrode 1031 by the data line 102 requires to a stable voltage for a time period. In an embodiment of the present disclosure, the overlapping regions of the orthographic projection of the data line 102 on the base substrate 101 with the orthographic projections of the two adjacent columns of pixel electrodes 1031 on the base substrate 101 may result in a capacitance being generated between the data line 102 and the overlapping regions, which capacitance may cause adverse affection on the voltage stabilization on the pixel electrode 1031 to some extent and thus in turn cause negative influence on display performance. The array substrate according to an embodiment of the disclosure further may include: a color filter layer 104 disposed between the layer in which the data line 102 is located and the pixel electrode layer 103. With this configuration, a distance between the data line 102 and the pixel electrode 1031 is increased so as to reduce the capacitance between them, reducing risk of interruption on the voltage stabilization on the pixel electrode 1031 due to the capacitance therebetween. In one embodiment, the thickness of the color resist layer is set such that the maximum capacitance generated between the data line 102 and the pixel electrode 1031 in the array substrate is less than a predetermined value. In addition, configuration of the color filter layer 104 on the array substrate may also avoid not-strict-alignment between the color filter layer 104 and the pixel electrode 1031 and thus may increase aperture ratio of a display panel and thus increase brightness of the display panel.

In an embodiment of the present disclosure, the array substrate may further include a planarization layer 105 between the color filter layer 104 and the pixel electrode layer 103 so as to further increase the distance between the data line 102 and the pixel electrode 1031 and thus further reduce the capacitance between them.

Generally, the color filter layer 10 includes a plurality of color filters with different colors. During manufacturing, an overlapping region may be formed between any two adjacent color filters such that a step or height difference is generated and thus the liquid crystal over the overlapping region will be in backward dislocation due to the step or height difference, which seriously affects display performance. In the embodiment, provision of the planarization layer 105 on the color filter layer 104 may reduce the step or height difference due to overlapping between any two adjacent color filters in the color filter layer 104 and thus enhance display quanlity.

In this embodiment, the planarization layer 105 may be made of polyacrylic resin, polyepoxy-acrylic resin, photosensitive polyimide resin, polyester acrylic resin, polyurethane acrylate resin, phenolic epoxy acrylic resin or other organic insulating material, which is not limited herein.

In an embodiment of the present disclosure, the array substrate may further include a thin film transistor, which specifically may be of a bottom-gate type structure or may be of a top-gate structure, which is not limited herein.

Figure 4A:
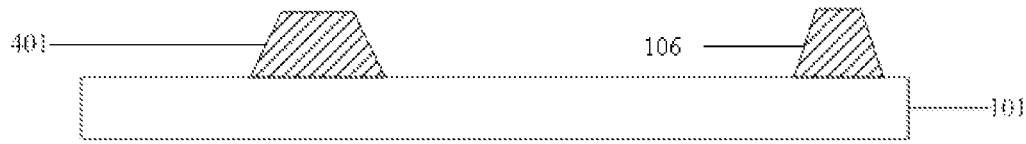
FIGS. 4a~4g are schematic view illustrating structures obtained by respective step of the process of manufacturing an array substrate, as shown in FIG. 3.
Figure 4B:
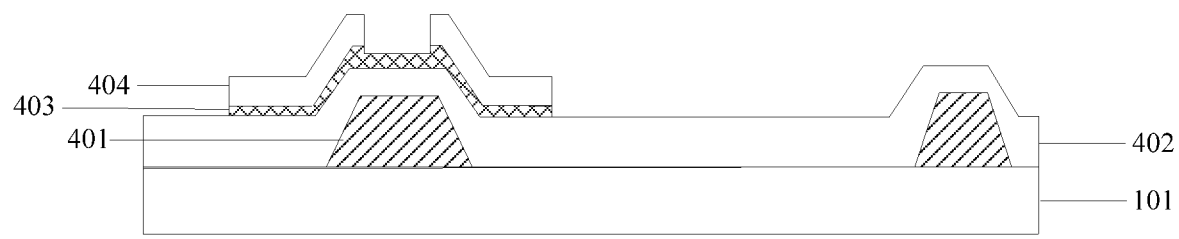
Figure 4C:
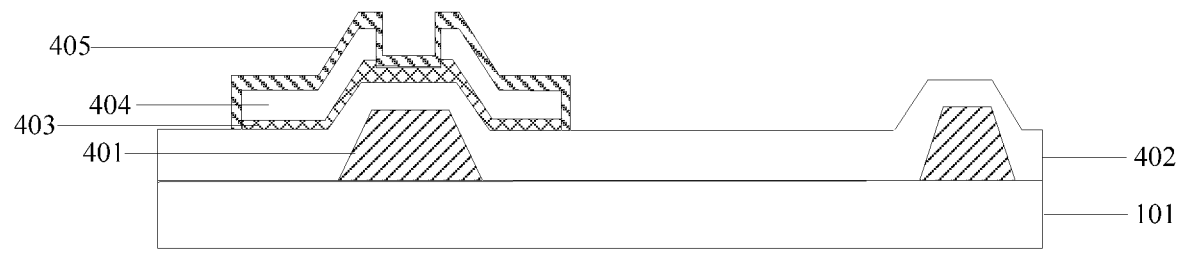
Figure 4D:
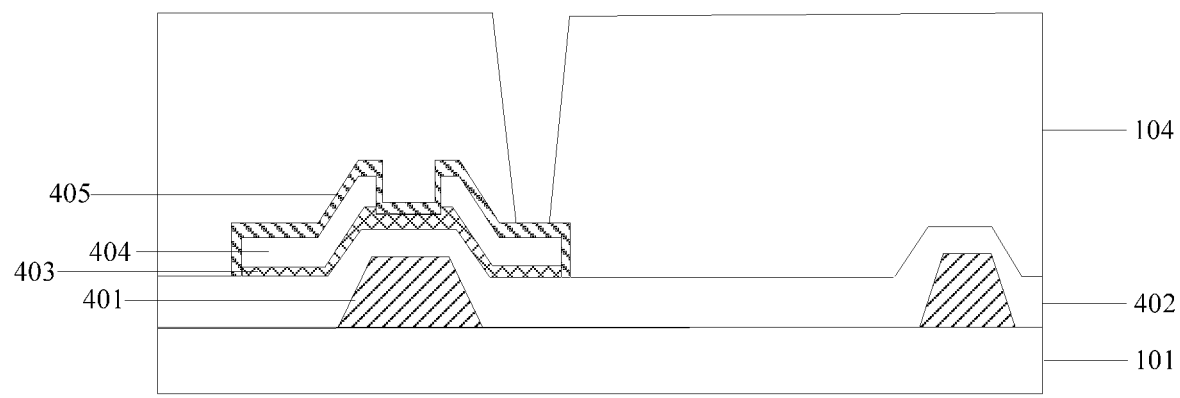
Figure 4E:
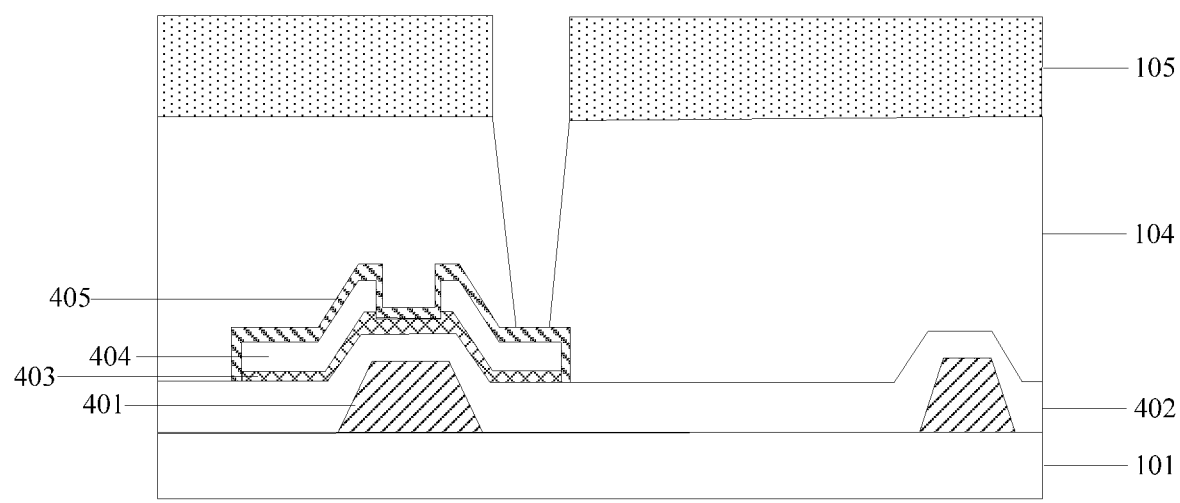
Figure 4F:
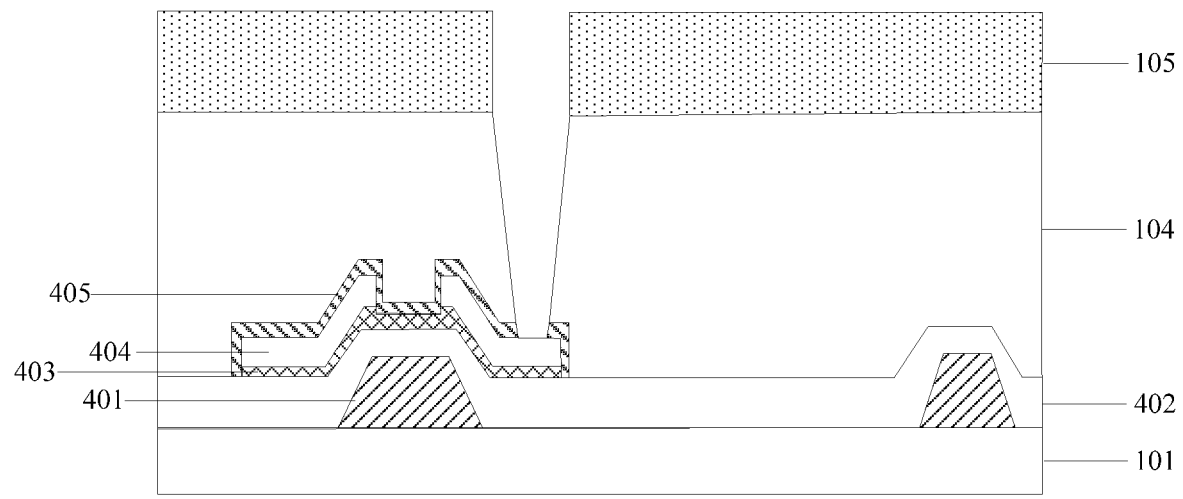
Figure 4G:
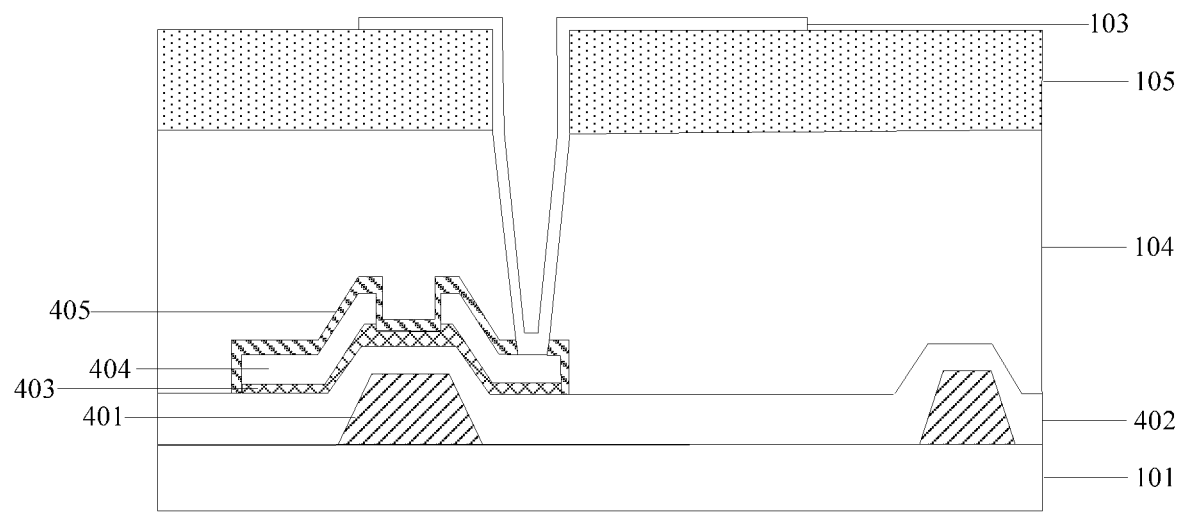

In an embodiment of the present disclosure, the thin film transistor of the array substrate is a bottom-gate thin film transistor, as shown in for example FIG. 4g. In the array substrate according to the embodiment, drain and source electrodes 404 are located over an active layer 403, a gate electrode 401 is located under the active layer 403, a gate insulating layer 402 is provided between the gate electrode 401 and the active layer 403, and a passivation layer 405 is provided over a layer in which the drain and source electrodes 404 are located. The array substrate may further include the color filter layer 104 on the gate insulating layer 402 and the planarization layer 105 on the color filter layer 104. The array substrate may further include the pixel electrode 1031 located over the drain and source electrodes 404 of the corresponding thin film transistor, and each pixel electrode 1031 is electrically connected with the drain electrode or source electrode 404 of the corresponding thin film transistor via a through hole penetrating through the passivation layer 405, the color filter layer 104 and the planarization layer 105.

In the embodiment, the gate electrode 401 and the drain and source electrodes 404 may be formed from materials including molybdenum, aluminum, tungsten, titanium, copper or an alloy combination thereof, which is not limited herein. The gate insulating layer 402 and the passivation layer 405 may be formed from materials including silicon oxide, silicon nitride or a combination thereof, which is not limited herein. The active layer 403 may be formed from a material including a polycrystalline silicon semiconductor material, an amorphous silicon semiconductor material, an oxide compound semiconductor material, or an organic semiconductor material, which is not limited herein.

Figure 2:
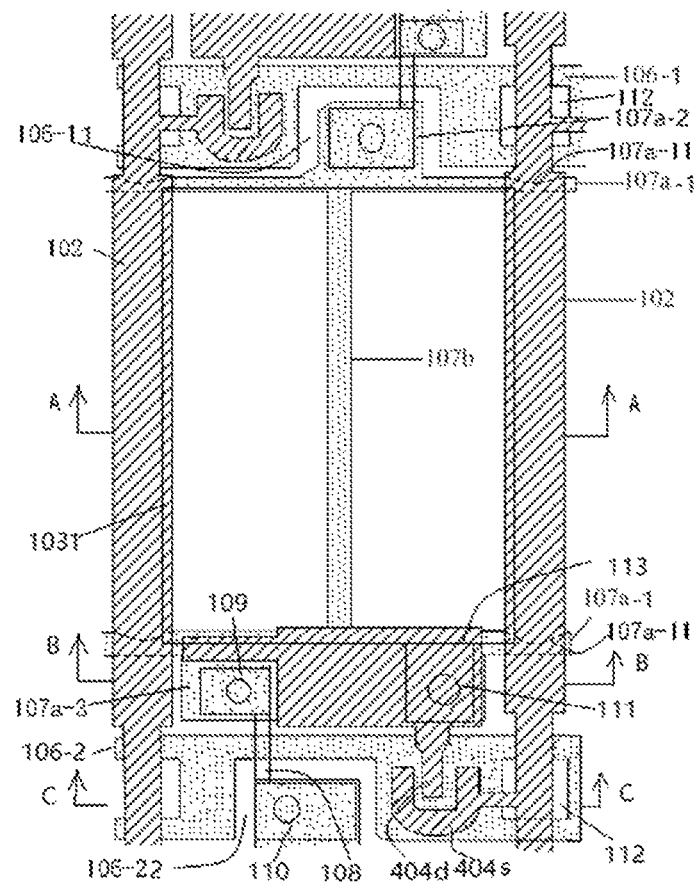
FIG. 2 is a schematic view illustrating relative position relationship between a second common electrode line and a pixel electrode in an array substrate according to an embodiment of the present disclosure.

In practice, as shown in FIG. 2, the array substrate according to an embodiment of the present disclosure may further include: a gate line 106 extending in a first direction and disposed between the base substrate 101 and a layer in which the data line 102 is located; and a plurality of first common electrode lines 107a and second common electrode lines 107b that are arranged in the same layer as the gate line 106. In the embodiment, the gate line 106 is configured to provide a scan signal to each pixel electrode 1031 and extend in the first direction; the data line is configured to extend in a second direction, the second direction being substantially perpendicular to the first direction. Here, it should be noted that the first direction and the second direction need not be strictly perpendicular to each other. The respective first common electrode lines 107a and second common electrode lines 107b are configured to provide a common voltage signal to a common electrode. In the embodiment as shown in FIG. 2, the first common electrode line 107a in the array substrate extends in the first direction, for example, in a horizontal direction, and the second common electrode line 107b extends in the second direction, for example, in a vertical direction.

According to the embodiment, the gate line 106, the first common electrode lines 107a and second common electrode lines 107b may be manufactured by a single patterning process so as to simplify process, save manufacturing cost, and increase production efficiency, or alternatively, may be manufactured by two patterning processes, which is not limited herein. In addition, the gate line 106, the first common electrode lines 107a and the second common electrode lines 107b may be made of molybdenum, aluminum, tungsten, titanium, copper or an alloy combination thereof, which is not limited herein.

According to an embodiment of the present disclosure, the drain and source electrodes 404 and the data line 102 may be manufactured by a single patterning process so as to simplify process, save manufacturing cost, and increase production efficiency, or alternatively, may be manufactured respectively by two patterning processes, which is not limited herein. In addition, the drain and source electrodes 404 and the data line 102 may be manufactured from molybdenum, aluminum, tungsten, titanium, copper or an alloy combination thereof, which is not limited herein.

In an embodiment of the present disclosure, in the array substrate, the second common electrode lines 107b are in one-to-one correspondence with the pixel electrodes so as to obtain uniformity in displayed image.

In an embodiment of the present disclosure, an orthographic projection of one of the second common electrode lines 107b on the base substrate 101 is located at a central line of an orthographic projection of a corresponding column of pixel electrodes on the base substrate 101. Referring to FIG. 2, a relative position relationship between the orthographic projection of one of the second common electrode lines 107b on the base substrate 101 and the orthographic projection of one pixel electrode 1031 of the corresponding column of pixel electrodes on the base substrate 101 is schematically illustrated.

With this configuration, obtained effective display areas that correspond to the pixel electrodes 1031 are symmetrical so as to increase uniformity of displayed image. Further, as the color filter layer 104 over a layer in which the second common electrode lines 107b are located is a relative thick, the second common electrode lines 107b will be not visible at a display side of the display panel, that is, the aperture ratio of the display panel will be not affected, even though the orthographic projection of the second common electrode lines 107b on the base substrate 101 were be at the central line of the orthographic projection of a corresponding column of pixel electrodes on the base substrate 101.

In one embodiment of the present disclosure, as shown in FIG. 2, an array substrate includes a base substrate, a gate line 106 extending in a first direction, and a data line 102 extending in a second direction, the first direction is substantively perpendicular to the second direction and the gate line 106 and the data line 102 define a plurality of sub-pixel units each having a corresponding pixel electrode 1031. For example, referring to FIGS. 2, 6-8, and 10, in one sub-pixel unit, the array substrate includes: the gate line 106, a first common electrode line 107a, and a second common electrode line 107b in the same layer on the base substrate 101 (which may be called as a gate line layer); the data line 102 and the source/drain electrode 404 (404d/404s) (which may be called as a data line layer) in the same layer above (that is, on the side away from the base substrate 101) the gate line, the first common electrode line 107a, and the second common electrode line 107b; and a pixel electrode 1031 (which may be called as a pixel electrode layer) on the side of the data line 102 and the source/drain electrode 404 away from the base substrate 101.

Figure 10:
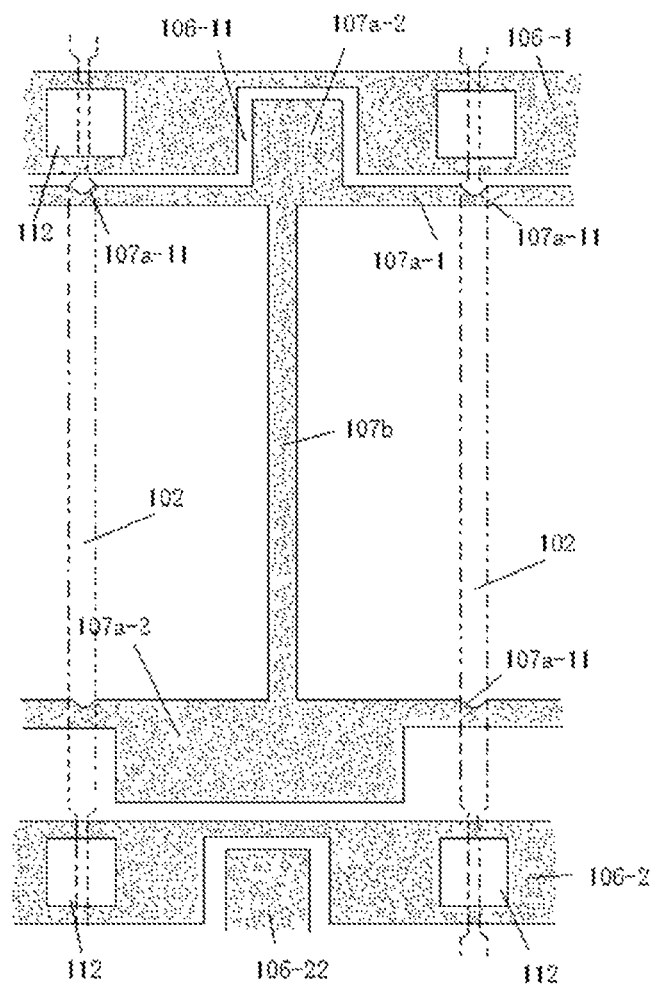
FIG. 10 shows a plan view of the layer where a gate line of the array substrate is located.

In one embodiment, as shown in FIGS. 2 and 10, each of the first common electrode lines 107a may include two first common electrode line first portions 107a-1 extending in the first direction, a first common electrode line second portion 107a-2 and a first common electrode line third portion 107a-3. The first common electrode line second portion 107a-2 is located on an upper side of the first common electrode line first portion 107a-1, that is the opposite side of the pixel electrode, and the first common electrode line third portion 107a-3 is located on a lower side of the first common electrode line first portion 107a-1, that is the opposite side of the pixel electrode; in other words, the two first common electrode line first portions 107a-1 are located between the first common electrode line second portion 107a-2 and the first common electrode line third portion 107a-3. With respect to the first direction (a horizontal direction as shown in FIG. 2), a width of the two first common electrode line first portions 107a-1 is narrower, and a width of the first common electrode line second portion 107a-2 and a width of the first common electrode line three portion 107a-3 are larger than the width of the first common electrode line first portions 107a-1. The widths of the two first common electrode lines first portions 107a-1 may be equal or unequal; the width of the first common electrode line second portion 107a-2 and the width of the first common electrode line third portion 107a-3 may be equal or may be unequal, but both are larger than the width(s) of the two first common electrode line first portions 107a-1. The first common electrode line second portion 107a-2 on the upper side and the first common electrode line third portion 107a-3 on the lower side may have the same shape or different shapes. For the sub-pixel unit, the first common electrode line second portion 107a-2 is connected to the upper first common electrode line first portion 107a-1 and is located on a side of the upper first common electrode line first portion 107a-1 opposite to the corresponding one pixel electrode; the first common electrode line third portion 107a-3 is connected to the lower first common electrode line first portion 107a-1 and is located on the side of the lower first common electrode line first portion 107a-1 opposite to the corresponding one of the pixel electrodes; the first common electrode line second portion 107a-2 and the first common electrode line third portion 107a-3 are located on opposite sides of the corresponding one of the pixel electrodes, so that the first common electrode line third portion 107a-3 of the sub-pixel unit 3 and the first common electrode line second portion 107a-2 of one sub-pixel unit adjacent in the second direction are located on two sides of the gate line respectively.

In the sub-pixel unit, as shown in FIG. 2, the two first common electrode line first portions 107a-1 are respectively located on the upper and lower edges of the pixel electrode 1031, and the edges of the pixel electrode 1031 and the two first common electrode lines first portions 107a-1 have a first overlapping portion, so that light leakage phenomenon can be avoided.

The second common electrode line 107b of the array substrate is disposed in the same layer as the first common electrode line 107a. In fact, the second common electrode line 107b is directly connected to the first common electrode line 107a, that is, the second common electrode line 107b is directly connected to the first common electrode line first portion 107a-1; or, the second common electrode line 107b and the first common electrode line first portion 107a-1 are integral and named separately for distinguishing their structural features. One second common electrode line 107b is between two first common electrode line first portions 107a-1, or one second common electrode line 107b and two first common electrode line first portions 107a-1 form a shape of "I". In one embodiment, in the sub-pixel unit, the second common electrode line 107b extending in the second direction is between the two first common electrode line first portions 107a-1 extending in the first direction and located in or near a substantially center line position of the two first common electrode line first portions 107a-1. In this embodiment, an orthographic projection of one pixel electrode on the base substrate 101 covers an opening of the pixel and an orthographic projection of the second common electrode line 107b on the base substrate 101, and an orthographic projection of the first common electrode line first portion 107a-1 on the upper side of the pixel electrode 1031 on the base substrate 101 and an orthographic projection of the first common electrode line first portion 107a-1 on the lower side of the pixel electrode 1031 on the base substrate 101 overlap the edges, on the opposite sides, of the orthographic projection of the pixel electrode 1031 on the base substrate 101, respectively.

In one embodiment, as shown in FIGS. 2 and 10, the array substrate includes a gate line 106 formed in the same layer as the first common electrode line 107a and the second common electrode line 107b, or even through a single process. The sub-pixel unit includes a first gate line 106-1 at an upper side and a second gate line 106-2 at a lower side, as can be clearly seen from FIG. 10, and the first gate line 106-1 on the upper side and the second gate line 106-2 on the lower side may have different shapes. The first gate line 106-1 on the upper side has a first rectangular groove 106-11, the first common electrode line second portion 107a-2 on the upper side is arranged in the first rectangular groove 106-11 and is not in contact with the first gate line 106-1, and left and right sides of the first common electrode line second portion 107a-2 are spaced from the two corresponding sides of the first rectangular groove 106-11 of the first gate line 106-1 at approximately equal distance, whereby lateral parasitic capacitances generated between the first common electrode line second portion 107a-2 and the two corresponding sides of the first rectangular groove 106-11 of the first gate line 106-1 can be equal. The second gate line 106-2 on the lower side has a second rectangular groove 106-22, and the first common electrode line second portion 107a-2 in the adjacent sub-pixel unit is arranged in and is not in contact with the second rectangular groove 106-22, left and right sides of the first common electrode line second portion 107a-2 in the adjacent sub-pixel unit are spaced from the two corresponding sides of the second rectangular groove 106-22 at substantially equal distance, thereby lateral parasitic capacitances generated between both sides of the first common electrode line second portion 107a-2 in the adjacent sub-pixel unit and the two corresponding sides of the second rectangular groove 106-22 of the second gate line 106-2 can be equal.

The first rectangular groove 106-11 of the first gate line 106 allows the first common electrode line second portion 107a-2 and the first common electrode line third portion 107a-3 in another sub-pixel unit on both sides of the first gate line 106-1 are close to each other. The second rectangular groove 106-22 of the second gate line 106-2 allows the first common electrode line third portion 107a-3 and the first common electrode line second portions 107a-2 in another sub-pixel unit on both sides of the second gate line 106-2 are close to each other. The first gate line 106-1 and the second gate line 106-2 have different configurations. As can be seen in FIG. 10, the first rectangular groove 106-11 of the first gate line 106-1 is shifted rightwards with respect to the second common electrode line 107b located at the center line position of the first common electrode line first portion 107a-1, and the second rectangular groove 106-22 of the second gate line 106-2 is shifted leftwards with respect to the second common electrode line 107b located at the center line position of the first common electrode line first portion 107a-1. Accordingly, in the sub-pixel unit shown in FIG. 2, the first common electrode line second portion 107a-2 is shifted rightwards with respect to the second common electrode line 107b located at the center line position of the first common electrode line first portion 107a-1, while in the sub-pixel unit adjacent to and on the lower side of FIG. 2, the first common electrode line second portion 107a-2 is shift leftwards with respect to the second common electrode line 107b located at the center line position of the first common electrode line first portion 107a-1. The data line 102 and the source/drain electrode 404 (404d/404s) over the gate line layer cover a part of the gate line layer. For example, in one embodiment as shown in FIG. 2, the orthographic projection of the first common electrode line first portion 107a-1 on the base substrate 101 and an orthographic projection of the data line 102 on the base substrate 101 have a second overlapping area. In order to reduce a capacitance generated between the first common electrode line first portion 107a-1 and the data line 102 in the second overlapping area in an orthographic projection direction on the base substrate, as shown in FIG. 2, the first common electrode line first portion 107a-1 has an arc-shaped groove, which is shown by a broken line in FIG. 2 as it is blocked by the data line 102. In addition, in one embodiment, the first common electrode line first portion 107a-1 directly connected to the first common electrode line third portion 107a-3 may not have an arc-shaped groove, and/or the first common electrode line first portion 107a-1 directly connected to the first common electrode line second portion 107a-2 may not have an arc-shaped groove.

In one embodiment, as shown in FIG. 2, the gate line 106 includes a hollowed region 112, and the gate line 106 and the data line 102 above the gate line cross each other within the hollowed region 112. A width of a portion of the data line 102 above the hollowed region 112 (along an orthographic projection direction) is reduced. Due to the provision of the hollowed region 112, orthographic projections of the data line 102 and the gate line on the base substrate do not overlap, thereby overlapping area between the data line 102 and the gate line 106 in the orthographic projection direction on the base substrate is reduced, and thus parasitic capacitance generated by the two is reduced. As shown in FIG. 2, a connection point or connection portion between a source electrode 404s of a thin film transistor of the array substrate and the data line 102 is also located above the hollowed region 112 (in the orthographic projection direction). The data line 102 and the source electrode 404s are opaque, so that the hollowed region 112 is blocked, and no light leakage problem occurs; meanwhile, a parasitic capacitance between the data line 102, the source electrode 404s, and the gate line 106 can be reduced. In one embodiment, as shown in FIGS. 2 and 10 (the broken line in FIG. 10 is the data line 102), in the orthographic projection direction on the base substrate 101, portions of the hollowed region 112 located on opposite sides of the data line 102 are spaced from the two corresponding sides of the data line 102 at substantially equal distance, so that parasitic capacitances generated between the opposite portions of the hollowed region 112 of the gate line and the data line 102 are equal to each other.

In this embodiment, referring to FIG. 10, the first gate line 106-1 and the second gate line 106-2 extend in the first direction, and each includes a plurality of hollowed regions 112 arranged along the first direction.

In one embodiment, the first gate line 106-1 includes a plurality of first rectangular grooves 106-11 arranged in the first direction, and the second gate line 106-2 includes a plurality of second rectangular grooves 106-22 arranged in the first direction.

In one embodiment, the plurality of first rectangular grooves 106-11 or the second rectangular grooves 106-22 and the plurality of hollowed regions 112 are alternately and separatedly arranged in the gate line 106, that is, the plurality of hollowed regions 112 and the plurality of first rectangular grooves 106-11 in the first gate line 106-1 are alternately and separatedly arranged, and the plurality of hollowed regions 112 and the plurality of second rectangular grooves 106-22 in the second gate line 106-2 are alternately and separatedly arranged. It should be known that the gate line may not include the hollowed region.

Figure 6:
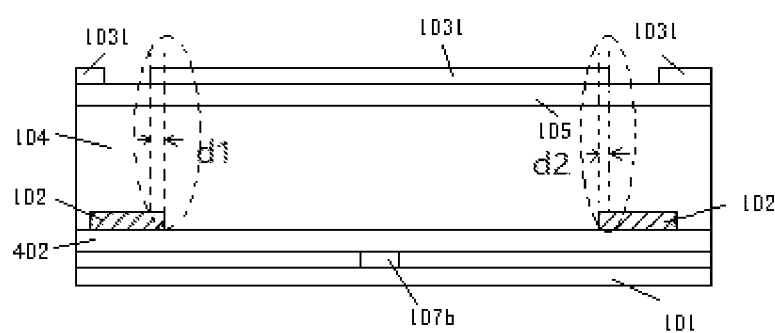
FIG. 6 shows a sectional view of the array substrate in FIG. 2 along line A-A.

In one embodiment, in the orthographic projection direction on the base substrate 101, the data line 102 extending in the second direction covers two adjacent pixel electrodes 1031. FIG. 6 is a sectional view of the array substrate in FIG. 2 along line A-A. As shown in FIG. 6, the orthographic projection of the data line 102 on the base substrate 101 covers the orthographic projection of the gap between the two adjacent pixel electrodes 1031 on the base substrate 101, and the width of the data line 102 is greater than a width of the gap 108 between the two adjacent columns of the pixel electrodes 1031. The two dashed blocks in FIG. 6 respectively show that the orthographic projections of the data line 102 and the pixel electrodes 1031 on both sides thereof on the base substrate 101 have third overlaping regions. In one embodiment, the orthographic projection of the data line 102 on the base substrate 101 and the third overlapping regions between the orthographic projection of the data line 102 and the orthographic projections of the pixel electrodes 1031 at left and right sides of the data line on the base substrate 101 have the same width; that is, in FIG. 6, the third overlapping region between the orthographic projection of the data line 102 at the left side of the pixel electrode 1031 on the base substrate 101 and the orthographic projection of the pixel electrode 1031 on the base substrate 101 has a width of d1, the third overlapping region between the orthographic projection of the data line 102 at the right side of the pixel electrode 1031 on the base substrate 101 and the orthographic projection of the pixel electrode 1031 on the base substrate 101 has a width of d2, and in the embodiment, d1=d2 (which is c, referring to the previous embodiment). In this embodiment, the orthographic projection of the second common electrode line 107b on the base substrate 101 may be near a middle position of the orthographic projections of the two adjacent data lines 102 on the base substrate 101. As shown in FIG. 6, the orthographic projection of the second common electrode line 107b on the base substrate 101 is separated from the orthographic projection of the data line 102 on the base substrate 101, or the orthographic projection of the second common electrode line 107b on the base substrate 101 does not overlap with the orthographic projection of the data line 102 on the base substrate 101.

The data line layer further includes a source electrode 404s and a drain electrode 404d. The source electrode 404s and the data line 102 are electrically connected above the hollowed region 112, or may be integrally formed (e.g., formed by a single process), and the drain electrode 404d is located above the first common electrode line third portion 107a-3, the right side of the drain electrode 404d is close to the data line 102 on the right side, and the left side of the drain electrode 404d is close to the data line 102 on the left side, so as to increase a storage capacitance. The source electrode 404s on the lower side shown in FIG. 2 is located above the second gate line 106-2 and close to the data line 102 on the right side, and the source electrode 404s on the upper side is located above the first gate line 106-1 and close to the data line 102 on the left side.

Figure 7:
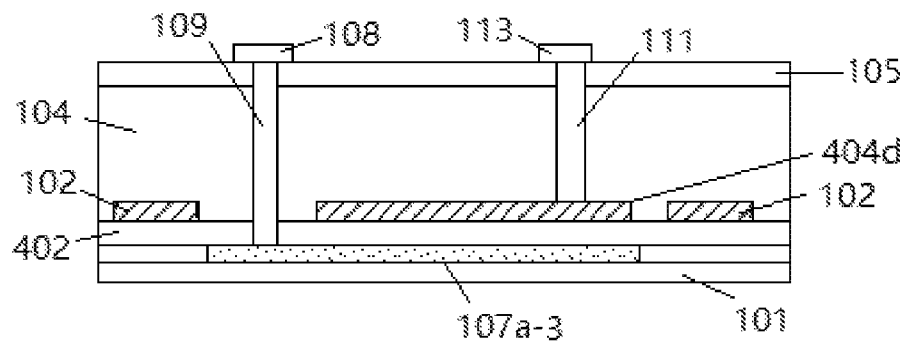
FIG. 7 shows a sectional view of the array substrate in FIG. 2 along line B-B.
Figure 8:
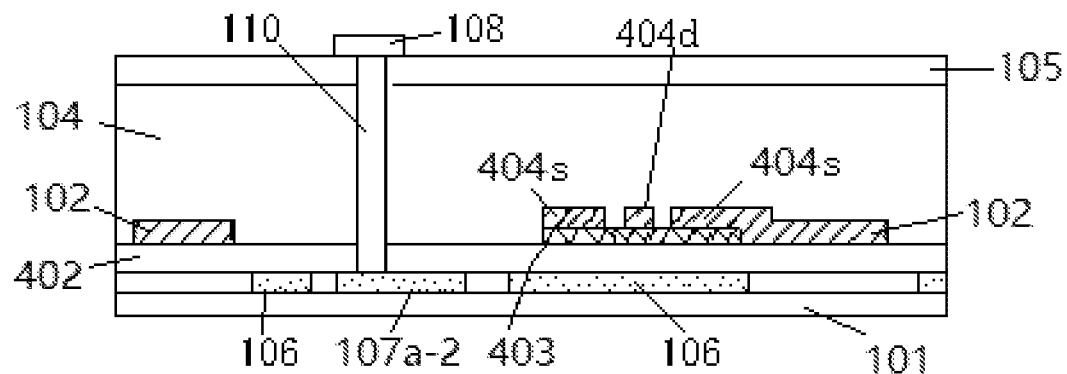
FIG. 8 shows a sectional view of the array substrate in FIG. 2 along line C-C.

In the sub-pixel unit shown in FIG. 2 (the lower portion of FIG. 2), a left portion of the drain electrode 404d has a notch, and the first common electrode line third portion 107a-3 under the notch of the drain electrode 404d may be led through a common electrode via 109. In one embodiment, the pixel electrode layer 103 includes the pixel electrode 1031 and a bridge portion 108. The first common electrode line third portion 107a-3 under the notch of the drain electrode 404d is electrically connected to the bridge portion 108 through the common electrode via 109, as shown in FIG. 7. Two ends of the bridge portion 108 are respectively located on either side of the second gate line 106-2, and a middle portion of the bridge portion 108 spans cross a portion, whose width is reduced by the second rectangular groove 106-22, of the second gate line 106-2. The first common electrode line second portion 107a-2 located in the second rectangular groove 106-22 is electrically connected to the end of the bridge portion 108 through the common electrode via 110. By the configuration of providing the bridge portion 108, the first common electrode line third portion 107a-3 of the sub-pixel unit shown in FIG. 2 on the array substrate may be electrically connected to the first common electrode line second portion 107a-2 of another sub-pixel unit adjacent to the sub-pixel unit so as to realize that the first and second common electrode lines on the array substrate are at the same voltage signal. The second rectangular groove 106-22 of the second gate line 106-2 allows the first common electrode line third portion 107a-3 and the first common electrode line second portion 107a-2 on either side of the second gate line 106-2 to be close to each other, reducing a size of the bridge portion 108 and thus reducing the parasitic capacitance between the bridge portion 108 and the second gate line 106-2 below.

Similarly, the first common electrode line second portion 107a-2 in the first rectangular groove 106-11 of the first gate line 106-1 in the upper portion of FIG. 2 is electrically connected to an end of the bridge portion 108 through the common electrode via 110 while the other end of the bridge portion 108 is electrically connected to the common electrode via 109 electrically connected to the first common electrode line third portion 107a-3 in the adjacent sub-pixel unit.

In one embodiment, in the first direction, the first common electrode line second portion 107a-2 is spaced from the gate lines adjacent to its opposite sides by an approximate equal distance, and/or the first common electrode line third portion 107a-3 is spaced from the gate lines adjacent to its opposite sides by an approximate equal distance.

The pixel electrode layer further includes a connection portion 113, which is electrically connected to the drain electrode 404d of the thin film transistor through a drain via 111 (referring to FIG. 7) located above the first common electrode line second portion, thereby electrically connecting the pixel electrode 1031 with the drain electrode 404d of the thin film transistor.

Figure 9:
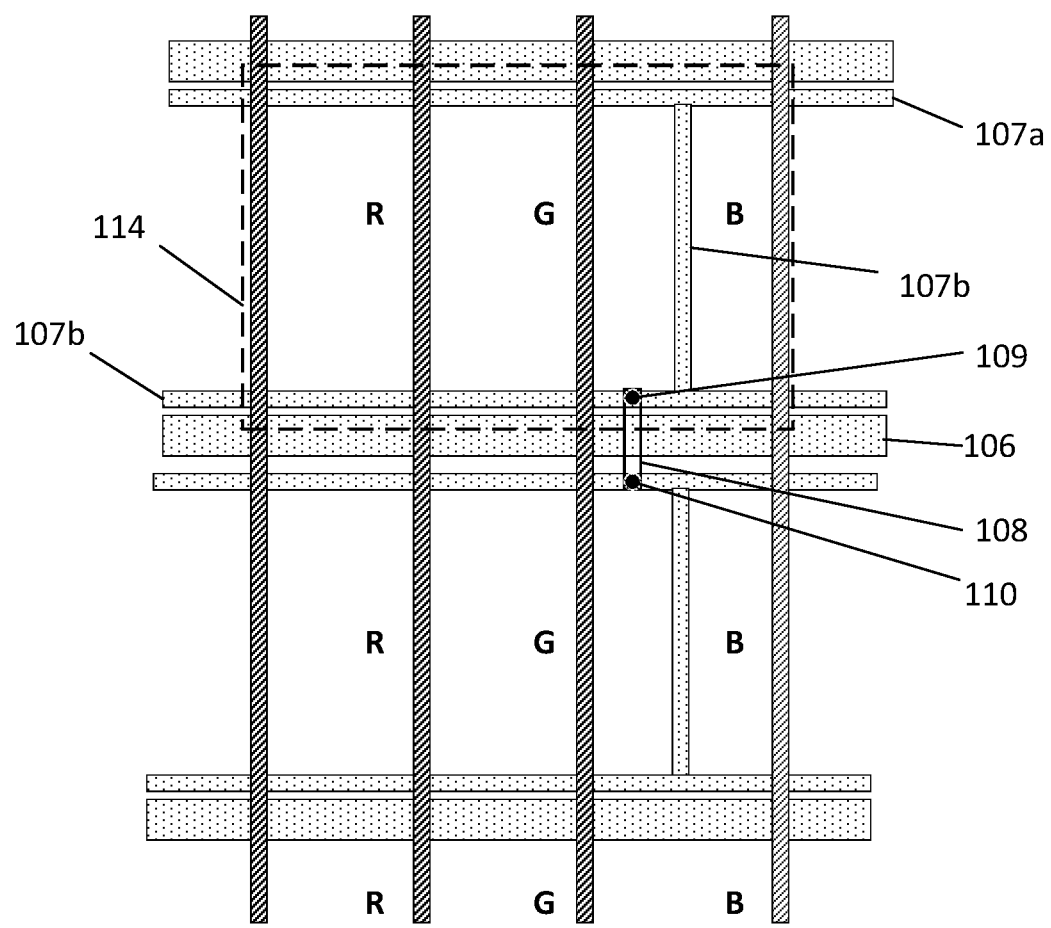
FIG. 9 shows a pixel unit of the array substrate, which shows a schematic diagram of arrangement of sub-pixels and a positional relationship between the sub-pixels and the second common electrode line.

In one embodiment, referring to FIG. 9, the pixel unit 114 includes a blue sub-pixel unit B, a red sub-pixel unit R, and a green sub-pixel unit G, and the three sub-pixel units are arranged as shown in FIG. 9. As shown in FIG. 9, in one embodiment, the orthographic projection of the second common electrode line 107b on the base substrate 101 may overlap an orthographic projection of the blue sub-pixel unit B on the base substrate 101. In one embodiment, the orthographic projection of the second common electrode line 107b on the base substrate 101 may not overlap orthographic projections of the red sub-pixel unit R and the green sub-pixel unit G on the base substrate 101. In one embodiment, the blue sub-pixel unit B may be located at a right part of the pixel unit, and the red sub-pixel unit R, the green sub-pixel unit G and the blue sub-pixel unit B are sequentially arranged in the sub-pixel unit along the extending direction of the gate line; however, in other embodiments, the blue sub-pixel unit B, the red sub-pixel unit R, and the green sub-pixel unit G may be arranged in other orders. Among the three types of sub-pixel units, the area of the blue sub-pixel unit B may be the largest.

In some embodiments, a colune of sub-pixel units are of the same color along the second direction, and the arrangement order of the sub-pixel units along the first direction is RGBRGBRGB.

Correspondingly, embodiments of the present disclosure provide a method of manufacturing an array substrate. Embodiments of the method of manufacturing the array substrate may refer to the implementation of the array substrate that is provided according to the above embodiments and will not be repeatedly described as the principle of the method for solving problem is similar to that of the above described array substrate.

Figure 3:
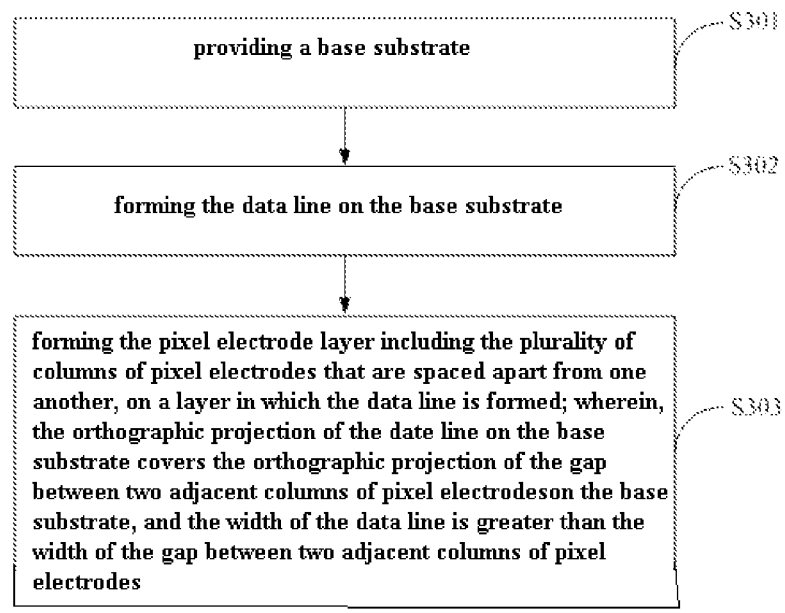
FIG. 3 illustrates a process of manufacturing an array substrate according to an embodiment of the present disclosure.

Specifically, embodiments of the present disclosure provide a method of manufacturing the above array substrate, as shown in FIG. 3. The method may specifically include the following steps:

S301: providing the base substrate;

S302: forming the data line on the base substrate;

S303: forming the pixel electrode layer including the plurality of columns of pixel electrodes that are spaced from one another, on a layer in which the data line is formed; wherein, the orthographic projection of the date line on the base substrate covers the orthographic projection of the gap between two adjacent columns of pixel electrodes on the base substrate, and the width of the data line is greater than the width of the gap between two adjacent columns of pixel electrodes.

In practice, the above method provided by the embodiments of the present disclosure may further include: before forming the pixel electrode layer including the plurality of columns of pixel electrodes that are spaced from one another on the layer in which the data line is formed, forming the color filter layer on the layer in which the data line is formed, thereby reducing the capacitance between the data line and the pixel electrode.

Specifically, the above method provided by the embodiments of the present disclosure may further include: before forming the pixel electrode layer including the plurality of columns of pixel electrodes that are spaced from one another on the layer in which the data line is formed and after forming color filter layer on the layer in which the data line is formed, forming the planarization layer on the color filter layer, thereby further reducing the capacitance between the data line and the pixel electrode.

The above method provided by the embodiment of the present disclosure may further includes: before forming the data line on the base substrate, simultaneously forming the gate line extending in the first direction and a plurality of first common electrode lines extending in the first direction and a plurality of second common electrode lines extending in the second direction; wherein the second common electrode lines are in one-to-one correspondence with the pixel electrodes, and the orthographic projection of one of the second common electrode lines on the base substrate is located at the central line of the orthographic projection of a corresponding column of pixel electrodes on the base substrate, thereby increasing display uniformity of an image.

In order to understand the above method provided by the embodiments of the present disclosure better, embodiments of the present disclosure further provides structural schematic views for illustrating structures of the array substrate obtained after the steps of the above method, as shown in FIGS. 4a~4g.

According to the embodiments of the present disclosure, the thin film transistor in the array substrate may be of a bottom-gate type structure or may be of a top-gate structure, which is not limited herein. Illustration will be made by an example of a thin film transistor with a bottom-gate structure.

The base substrate 101 is provided and patterns of the gate electrode 401 and the gate line 106 on the base substrate 101 is formed by a single patterning process, as shown in FIG. 4a, thereby simplifying manufacturing process of the array substrate and reducing times of using mask;

patterns of the gate insulating layer 402, the active layer 403, the drain and source electrodes 404 and the data line are formed in turn on the base substrate 101 on which the gate electrode 401 and the gate line 106 have been formed, as shown in FIG. 4b;

a pattern of the passivation layer 405 is formed on the layer in which the drain and source electrodes 404 and the data line are located, as shown in FIG. 4c;

a pattern of the color filter layer 104 having a through hole therein is formed on the passivation layer 405, as shown in FIG. 4d;

a pattern of the planarization layer 105 having a through hole that is communicated with the though hole in the color filter layer 104 is formed on the color filter layer 104, as shown in FIG. 4e;

a though hole is formed in the passivation layer 405 over the layer in which the drain and source electrodes 404 and the data line are located, as shown in FIG. 4f; and a pattern of the pixel electrode layer 103 is formed on the planarization layer 105, wherein the pixel electrode 1031 is electrically connected with the corresponding drain electrode or source electrode 404 of the thin film transistor via the through hole penetrating through the passivation layer 405, the color filter layer 104 and the planarization layer 105, as shown in FIG. 4g.

It is noted that, in the method according to the above embodiments of the present disclosure, the patterning processes for forming the layers may include portion of or all of processes of deposition, photoresist coating, masking by a mask, exposure, development, etching, peeling-off of the photoresist, and may also include others process procedures, which may be designed depending on a pattern to be formed by an actual manufacturing process, and is not limited herein. For example, a post-baking process may be included after development and before etching.

In an embodiment, the deposition process may include a chemical vapor deposition process, a plasma chemical vapor deposition process, or a physical vapor deposition process, which is not limited herein. Mask used in a masking process may be a Half Tone Mask, a Modified Single Mask, a Single Slit Mask or a Gray Tone Mask, which is not limited herein. The etching process may be a dry etching process or a wet etching process, which is not limited herein.

Based on the same inventive concept, embodiments of the present disclosure provide a display panel. Embodiments of the display panel may refer to the implementation of the above array substrate provided in embodiments of the present disclosure and will not be repeatedly described as the principle of the display panel for solving problem is similar to that of the above described array substrate.

Figure 5:
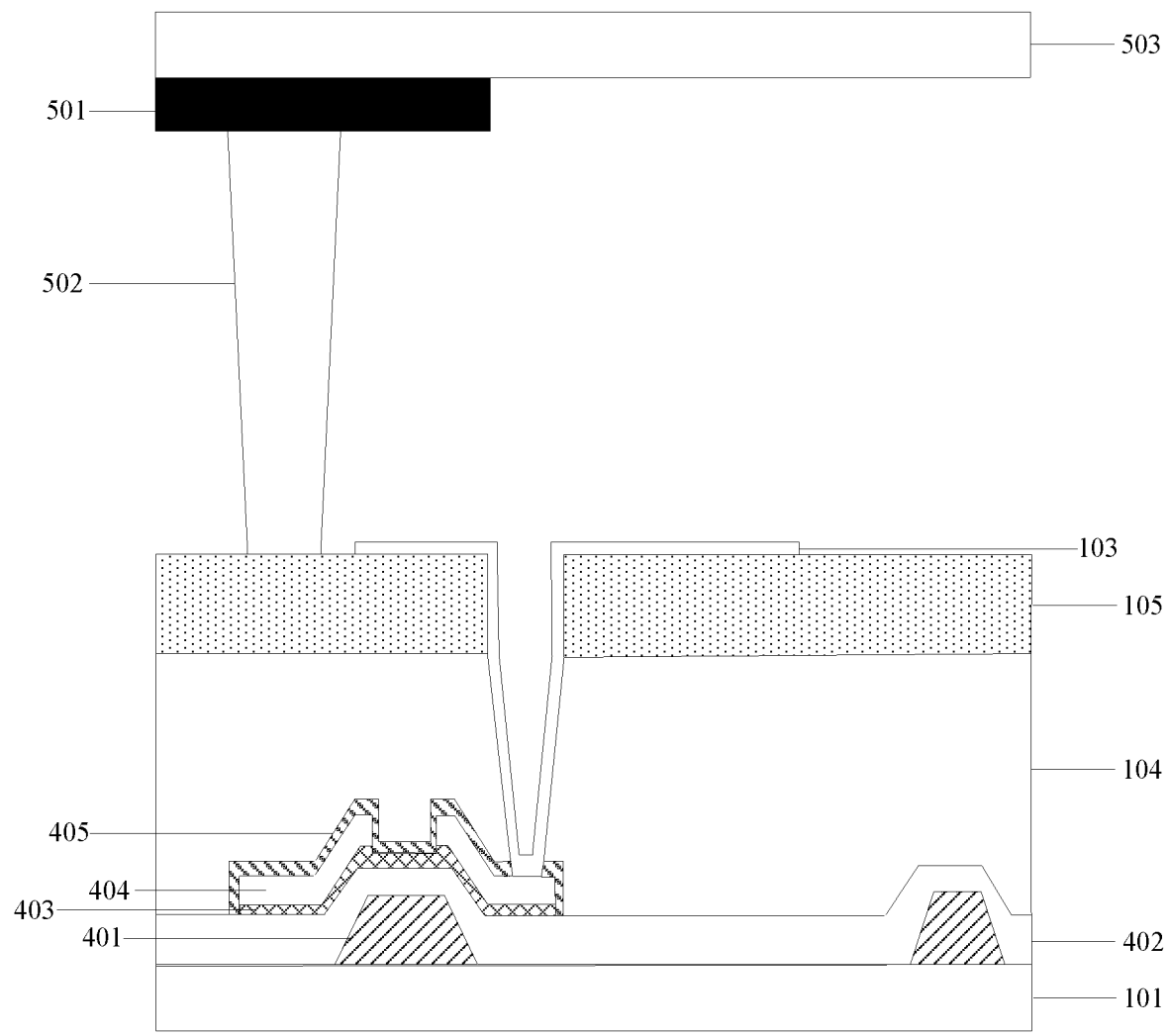
FIG. 5 is a structural schematic view of a display panel according to an embodiment of the present disclosure.

A display panel provided according to embodiments of the present disclosure, as shown in FIG. 5, includes the above array substrate and an opposite substrate configured to be opposite to the array substrate.

In an embodiment of the present disclosure, in order to prevent the color filter layer 104 from leaking light through a gap between any two adjacent color filters in the color filter layer 104, The display panel may further include a black matrix 501 configured on a side of the opposite substrate facing the array substrate, as shown in FIG. 5. Of course, in another embodiment of the present disclosure, the black matrix may be configured on a side of the array substrate facing the opposite substrate and is located at the gap between the color filters in the color filter layer.

In this embodiment, the black matrix 501 may not only prevent the color filter layer from leaking light from the gap between the color filters but also increase contrast between different colors. Generally, the black matrix 501 may be made of two types of materials, one of which is a metal film, such as an oxide film, and the other is resin-type black photoresist film and has a main material of carbon. In an embodiment, the black matrix 501 may be made of a metal film as the metal film may be easy to be etched to obtain line or path and has a good property of shielding light.

It is noted that in the above display panel provided by the embodiment of the present disclosure, in addition to make the black matrix 501 from the metal film or black resin material, the black matrix 501 may be obtained by overlapping a red-light color filter and a blue-light color filter to achieve effect of shielding light, which is not limited herein.

In an embodiment of the present disclosure, as shown in FIG. 5, in order to increase ability of anti-extrusion of the display panel, display panel may further include a plurality of photoresist spacers (PS) 502 between the array substrate and the opposite substrate.

In practice, in the display panel according to the embodiments of the present disclosure, generally, other films or structures may also be provided on the opposite substrate, such as a common electrode layer, a protective layer and the like, which may have various embodiments and are not limited herein.

A process of manufacturing the above display panel will be described below in detail by giving an example of manufacturing the display panel as shown in FIG. 5. The process specifically includes the following steps:

forming the array substrate structures as shown in FIGS. 4a-4g in sequence by implementing the above method of manufacturing the array substrate;

forming the protective layer, the black matrix 501, the common electrode layer (not shown in the drawing) and the photoresist spacer 502 in sequence on the base substrate 503 of the opposite substrate;

aligning and assembling the base substrate 101 of the array substrate with the base substrate 503 of the opposite substrate to form a cell.

It is noted that in practice, step (1) and step (2) are not limited to be done in the order as described in the above process of manufacturing the display panel, that is, step (2) may be implemented firstly and then step (1) may be done, which is not limited herein.

Specifically, in step (3) of the above process of manufacturing the display panel according to the embodiment of the present disclosure, after the aligning and assembling the base substrate 101 of the array substrate with the base substrate 503 of the opposite substrate to form a cell, molecules may be filled into the assembled display panel by means of an immersing way; or, after step (1) of the forming the array substrate structures as shown in FIGS. 4a~4g in sequence by implementing the above method of manufacturing the array substrate to obtain the above array substrate, molecules may be dropped and filled onto the base substrate 101 of the array substrate; or after step (2) of forming the protective layer (referring to FIG. 1), the black matrix 501, the common electrode layer (not shown in the drawing) and the photoresist spacer 502 in sequence on the base substrate 503 of the opposite substrate in the process of manufacturing the above display panel according to the embodiment of the present disclosure, molecules may be dropped and filled onto the base substrate 503 of the opposite substrate, which is not limited herein.

Based on the same inventive concept, embodiments of the present disclosure further provide a display device including the above display panel provided by the embodiments of the present disclosure. The display device may be a mobile phone, a tablet computer, a television, a display, a notebook computer, a digital photo frame, a navigator, a smart watch, a training wrist, a person digital assistant or any one of products or components having a display function. Embodiments of the display device may be implemented by referring to the above embodiments of the display panel and will not be repeatedly described.

The above array substrate and the method of manufacturing the same, the display panel and the display device according to the embodiments of the present disclosure include the base substrate, the data line disposed on the base substrate and the pixel electrode layer disposed on the layer in which the data line is located, wherein the pixel electrode layer includes the plurality of columns of pixel electrodes that are spaced from one another; the orthographic projection of the date line on the base substrate covers the orthographic projection of the gap between two adjacent columns of pixel electrodes on the base substrate, and the width of the data line is greater than the width of the gap between two adjacent columns of pixel electrodes. As the orthographic projection of the date line on the base substrate covers the orthographic projection of the gap between two adjacent columns of pixel electrodes on the base substrate and the width of the data line is greater than the width of the gap between two adjacent columns of pixel electrodes, a second electric field may be formed between the data line and the pixel electrode with the electrical field direction being directed from the array substrate to the opposite substrate, so as to control distortion of the liquid crystal and thus prevent light from leaking along the data line, and thus simultaneously, avoid need of black matrix to shielding light, thereby increasing aperture ratio.

Obviously, those skilled in the art may make modifications and changes on the embodiments of the present disclosure without deportioning from the spirit and scope of the present disclosure. As such, these modifications and changes should be included in the scope of the present disclosure if they fall into the scope of the claims and their equivalent of the present disclosure.

The invention claimed is:

1. An array substrate, comprising: a base substrate, a gate line above the base substrate and extending in a first direction, a data line above a layer where the gate line is located and extending in a second direction, and a pixel electrode layer above a layer where the data line is located, the first direction being substantially perpendicular to the second direction, the gate line and the data line defining a plurality of sub-pixel units;

wherein the array substrate further includes: a plurality of first common electrode lines and a plurality of second common electrode lines electrically connected to each other and disposed in a same layer as the gate line, wherein each of the plurality of first common electrode lines includes two first common electrode line first portions extending in the first direction, and the plurality of second common electrode lines extend in the second direction;

wherein in one sub-pixel unit, one of the plurality of first common electrode lines and one of the plurality of second common electrode lines are included and the one of the plurality of first common electrode lines includes two first common electrode line first portions, the one of the plurality of second common electrode lines being located between and electrically connecting the two first common electrode line first portions, an orthographic projection of the one of the plurality of second common electrode lines on the base substrate is located approximately on a center line of an orthographic projection of the one sub-pixel unit on the base substrate;

wherein the pixel electrode layer includes a plurality of pixel electrodes arranged in an array, each of the plurality of sub-pixel units includes one of the plurality of pixel electrodes, and the two first common electrode line first portions are respectively located at and respectively have first overlapping portions with edges on opposite sides of a corresponding one of the pixel electrodes;

wherein the one of the plurality of first common electrode lines further comprises a first common electrode line second portion and a first common electrode line third portion each having a width greater than a width of the two first common electrode line first portions;

wherein for the one sub-pixel unit, the first common electrode line second portion is connected to a first one of the two first common electrode line first portions and is located on a side of the first one of the two first common electrode line first portions opposite to the corresponding one of the pixel electrodes;

wherein the first common electrode line third portion is connected to a second one of the two first common electrode line first portions and is located on a side of the second one of the two first common electrode line first portions opposite to the corresponding one of the pixel electrodes; and wherein the first common electrode line second portion and the first common electrode line third portion are located respectively on opposite sides of the corresponding one of the pixel electrodes, so that the first common electrode line third portion of the one sub-pixel unit and the first common electrode line second portion of another sub-pixel unit adjacent to the one sub-pixel unit in the second direction are located on opposite sides of the gate line.

2. The array substrate as claimed in claim 1, wherein, in the one sub-pixel unit, the one of the plurality of second common electrode lines and the two first common electrode line first portions are formed in a shape comprising two horizontal portions connected at ends of a single central vertical portion.

3. The array substrate as claimed in claim 1, wherein the pixel electrode layer further comprises a bridge portion provided in the same layer as the pixel electrodes, and two ends of the bridge portion are respectively electrically connected, through common electrode vias located on opposite sides of the gate line, to the first common electrode line third portion and the first common electrode line second portion of the another sub-pixel unit adjacent to the one sub-pixel unit in the second direction, which are located on opposite sides of the gate line.

4. The array substrate as claimed in claim 1, wherein orthographic projections of the two first common electrode line first portions on the base substrate and an orthographic projection of the data line on the base substrate have a second overlapping area, and a part of the two first common electrode line first portions located in the second overlapping region has an arc-shaped groove.

5. The array substrate as claimed in claim 1, wherein the gate line includes a plurality of hollowed regions, the plurality of hollowed regions are arranged in the gate line along the first direction, and in an orthographic projection direction with respect to the base substrate, the data lines and the gate lines cross each other above the hollowed regions, and both sides of one of the data lines are approximately spaced from both sides of a corresponding one of the hollowed regions of the gate lines by an equal distance in the first direction.

6. The array substrate as claimed in claim 1, wherein the gate line includes a first gate line and a second gate line, the first gate line and the second gate line being respectively located on opposite sides of the corresponding one of the pixel electrodes in the one sub-pixel unit; and wherein:

the first gate line includes a plurality of first rectangular grooves arranged in the first direction, and the second gate line includes a plurality of second rectangular grooves arranged in the first direction; and the first common electrode line second portion of the one sub-pixel unit is arranged in the first rectangular groove of the first gate line and is spaced from two sides of the first rectangular groove at approximately equal intervals, and the first common electrode line third portion of another one of the sub-pixel units adjacent to the one sub-pixel unit is located in the second rectangular groove of the second gate line and is spaced from two sides of the second rectangular groove at approximately equal intervals.

7. The array substrate as claimed in claim 1, wherein the gate line includes a first gate line and a second gate line, the first gate line and the second gate line being respectively located on opposite sides of the corresponding one of the pixel electrodes in the one sub-pixel unit, and wherein:

the first gate line includes a plurality of first rectangular grooves arranged in the first direction, and the second gate line includes a plurality of second rectangular grooves arranged in the first direction, so that in a row of sub-pixel units in the first direction, the plurality of hollowed regions and the plurality of first rectangular grooves in the first gate line are alternately and separatedly arranged, and the plurality of hollowed regions and the plurality of second rectangular grooves in the second gate line are alternately and separatedly arranged; and the first common electrode line second portion of the one sub-pixel unit is arranged in the first rectangular groove of the first gate line and is spaced from two sides of the first rectangular groove at approximately equal intervals, amnd the first common electrode line second portion of another one of the sub-pixels units adjacent to the one sub-pixel unit is located in the second rectangular groove of the second gate line and is spaced from two sides of the second rectangular groove at approximately equal intervals.

8. The array substrate as claimed in claim 1, wherein the pixel electrode layer further comprises a connection portion provided in the same layer as the pixel electrodes, the connection portion being electrically connected to a drain electrode of a thin film transistor of the one sub-pixel unit through a drain electrode via located above the first common electrode line second portion, thereby electrically connecting the corresponding one of the pixel electrodes and the drain electrode of the thin film transistor.

9. The array substrate as claimed in claim 1, wherein the orthographic projection of the data line on the base substrate covers an orthographic projection of a gap between two adjacent columns of the pixel electrodes on the base substrate.

10. The array substrate as claimed in claim 1, wherein the orthographic projection of the data line on the base substrate and orthographic projections of the two adjacent columns of the pixel electrodes on the base substrate have third overlapping regions, which have equal widths in the second direction.

11. The array substrate as claimed in claim 1, wherein each of the plurality of pixel units includes a blue sub-pixel unit, a red sub-pixel unit, and a green sub-pixel unit, and in the orthographic projection direction with respect to the base substrate, the second common electrode line overlaps the blue sub-pixel unit and does not overlap the red sub-pixel unit or the green sub-pixel unit.

12. The array substrate as claimed in claim 1, further comprising a color resist layer disposed between the layer where the data line is located and the pixel electrode layer, wherein a thickness of the color resist layer is set such that a maximum value of a capacitance generated between the date lines and the pixel electrodes in the array substrate is less than a predetermined value.

13. The array substrate as claimed in claim 1, wherein:
the base substrate is a flexible base substrate and is made of polyvinylether phthalate, polyethylene naphthalate, polycarbonate, polyarylate, polyetherimide, polyethersulfone, polyimide or another plastic base plate; and/or
a planarization layer is made of polyacrylic resin, polyepoxy-acrylic resin, photosensitive polyimide resin, polyester acrylic resin, polyurethane acrylate resin, phenolic epoxy acrylic resin or another organic insulating material; and/or
the data line and drain and source electrodes are formed from materials selected from the group consisting of molybdenum, aluminum, tungsten, titanium, copper, and an alloy combination thereof.

14. A display panel comprising: the array substrate as claimed in claim 1, and a counter substrate opposed to the array substrate.

15. The display panel as claimed in claim 14, further comprising:
a black matrix disposed on a side of the counter substrate facing the array substrate; or
a black matrix disposed on a side of the array substrate facing the counter substrate, and a color resist layer disposed between the layer where the data line is located and the pixel electrode layer, the black matrix being located at a gap between two adjacent color filters of the color filter layer; the black matrix being formed by stacking a red-light color filter and a blue-light color filter.

16. A display device, comprising: the display panel as claimed in claim 14.

17. A method of manufacturing the array substrate as claimed in claim 1, the method comprising:
providing the base substrate;
forming the gate line extending in the first direction above the base substrate;
forming the data line extending along the second direction above the layer where the gate line is located, the first direction being substantially perpendicular to the second direction;
forming the pixel electrode layer including a plurality of columns of pixel electrodes spaced from each other on the layer where the data line is located;
the method further including:
forming simultaneously the gate line and the plurality of first common electrode lines and the plurality of second common electrode lines, extending in the first direction, on the base substrate, wherein each of the plurality of first common electrode lines includes two first common electrode line first portions extending in the first direction, and the plurality of second common electrode lines extend in the second direction.

* * * * *

UNITED STATES PATENT AND TRADEMARK OFFICE
CERTIFICATE OF CORRECTION

PATENT NO. : 11,073,734 B2  
APPLICATION NO. : 16/892918  
DATED : July 27, 2021  
INVENTOR(S) : Zhicai Xu et al.

Page 1 of 1

It is certified that error appears in the above-identified patent and that said Letters Patent is hereby corrected as shown below:

On the Title Page

(30) Foreign Application Priority Data:  
Insert --May 19, 2020 (CN) 202020843525.2--

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*